United States Patent [19]
Tomita et al.

[11] Patent Number: 5,430,678
[45] Date of Patent: Jul. 4, 1995

[54] SEMICONDUCTOR MEMORY HAVING REDUNDANT CELLS

[75] Inventors: Naoto Tomita; Junichi Miyamoto, both of Yokohama, Japan

[73] Assignee: Kabushiki Kaisha Toshiba, Kanagawa, Japan

[21] Appl. No.: 853,729

[22] PCT Filed: Oct. 2, 1991

[86] PCT No.: PCT/JP91/01323

§ 371 Date: Jun. 1, 1992

§ 102(e) Date: Jun. 1, 1992

[87] PCT Pub. No.: WO92/06475

PCT Pub. Date: Apr. 16, 1992

[30] Foreign Application Priority Data

Oct. 2, 1990 [JP] Japan .................... 2-264108

[51] Int. Cl.[6] ............................. G11C 29/00
[52] U.S. Cl. ............................. 365/200; 365/201; 371/21.1; 371/10.1
[58] Field of Search ............... 365/200, 201, 210, 218, 365/900; 371/21.1, 21.2, 10.1, 10.2, 10.3, 11.1

[56] References Cited

U.S. PATENT DOCUMENTS

| | | | |
|---|---|---|---|
| 4,791,319 | 12/1988 | Tagami et al. | 365/200 |
| 4,796,233 | 2/1989 | Awaya et al. | 365/200 |
| 4,860,260 | 8/1989 | Saito et al. | 365/200 |
| 4,870,618 | 9/1989 | Iwashita | 365/185 |
| 4,905,192 | 2/1990 | Nogami et al. | 365/200 |
| 4,956,816 | 9/1990 | Atsumi et al. | 365/201 |
| 4,999,812 | 3/1991 | Amin | 365/900 |
| 5,197,030 | 3/1993 | Akasgi et al. | 365/200 |
| 5,299,161 | 3/1994 | Choi et al. | 365/201 |

FOREIGN PATENT DOCUMENTS

| | | |
|---|---|---|
| 61-289600 | 12/1986 | Japan . |
| 63-81700 | 4/1988 | Japan . |
| 1-112598 | 5/1989 | Japan . |
| 1-133297 | 5/1989 | Japan . |
| 3-22300 | 1/1991 | Japan . |

Primary Examiner—Joseph A. Popek
Assistant Examiner—Vu Le
Attorney, Agent, or Firm—Finnegan, Henderson, Farabow, Garrett & Dunner

[57] ABSTRACT

A semiconductor memory comprises a memory cell (20) array in which memory cells (M) are placed at the intersections of word lines (WL1 to WLM) and bit lines (BL1 to BLn), a bit line select circuit (21) coupled with the bit lines (BL1 to BLn) for selecting the bit lines, a potential supply circuit (22) coupled with the bit lines (BL1 to BLn) through the bit line select circuit (21) for applying a predetermined potential (VPP) to the bit lines, at least one redundancy bit line (BLR1 to BLRi) which, in case that there is a defective bit line among the bit lines, is to be used for the defective bit line, a redundancy line select circuit (24) for, in case that the redundancy bit line is used, for selecting the redundancy bit line, an address storage circuit (25) for storing an address for replacing the defective bit line with the redundancy bit line in case that it is used, and a control circuit (26) for, in case that the bit lines are selected by the select circuit (21), selecting the bit lines excluding the defective bit line whose address has been stored in the address storage circuit (25).

20 Claims, 12 Drawing Sheets

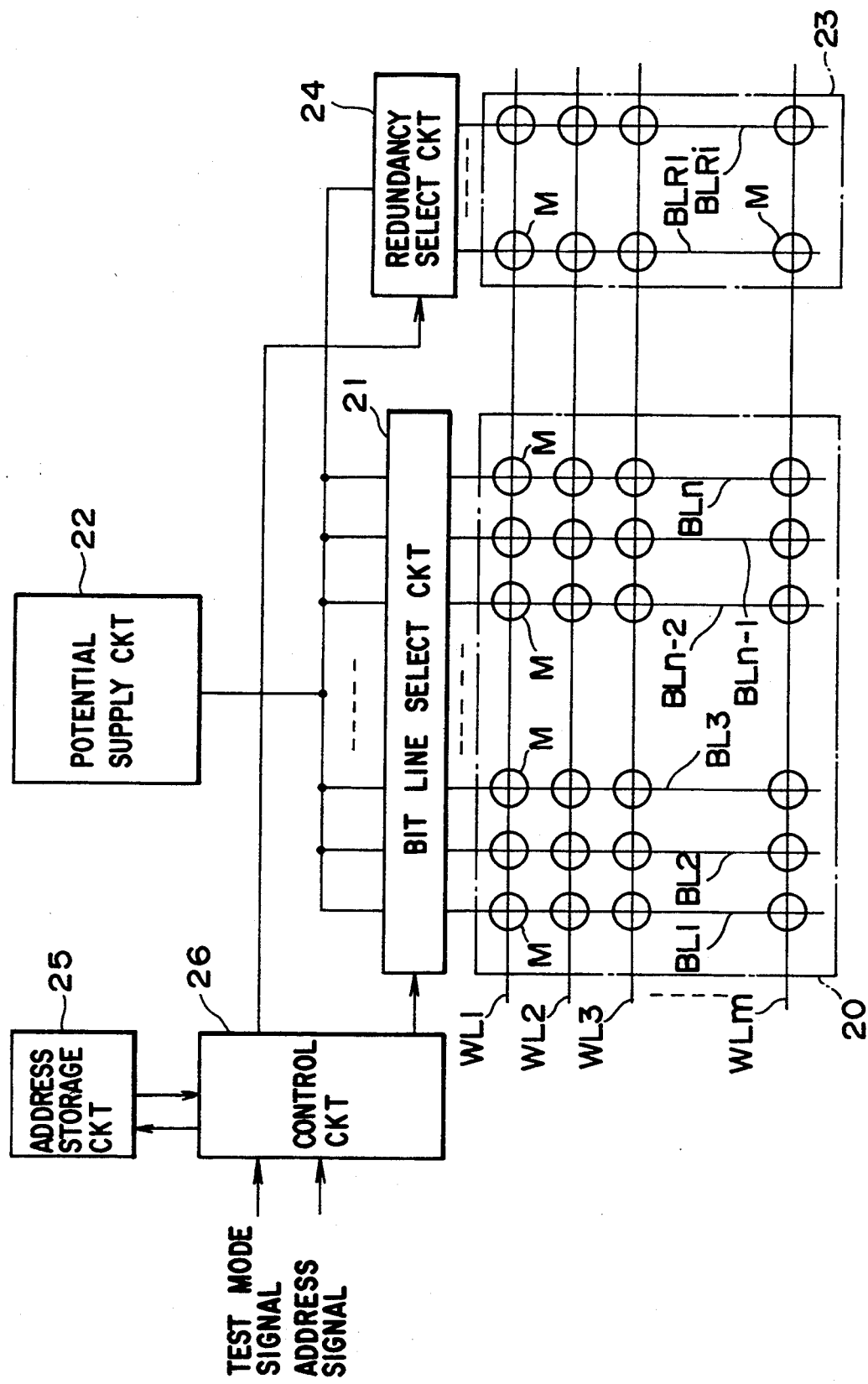
F I G. 3

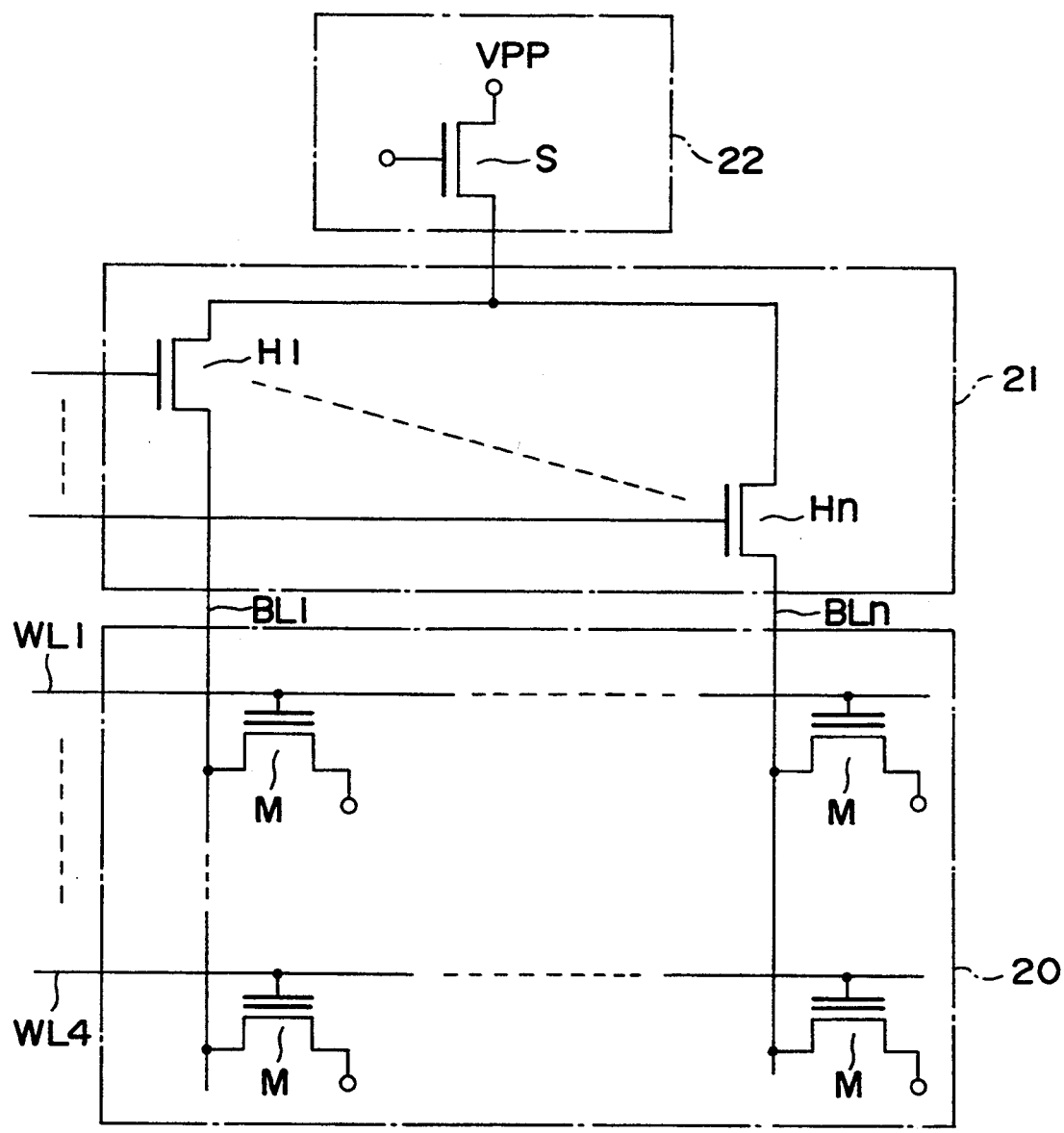
F I G. 4

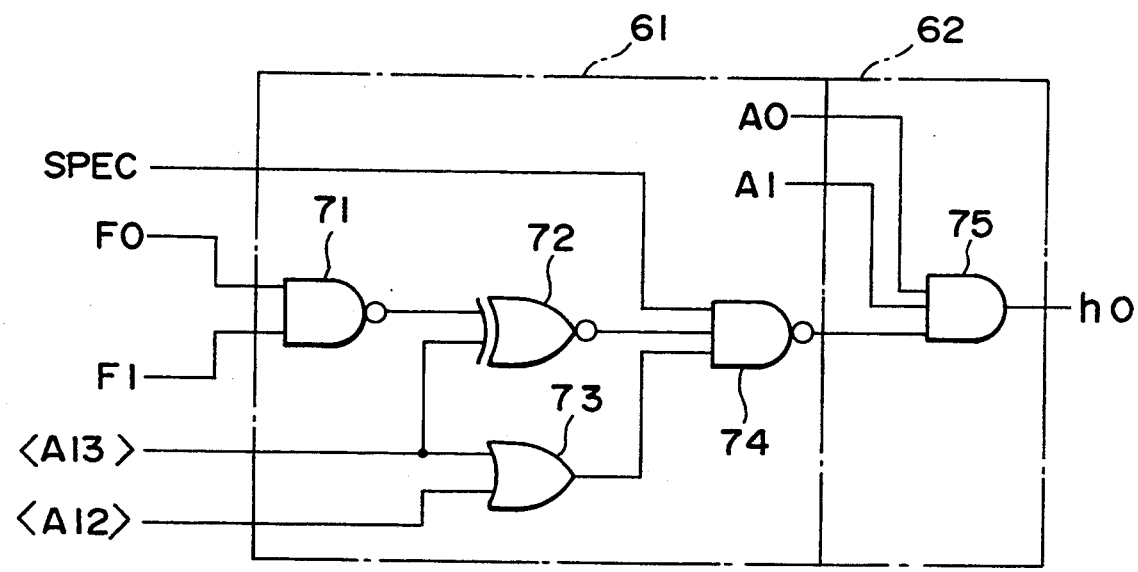
F I G. 10
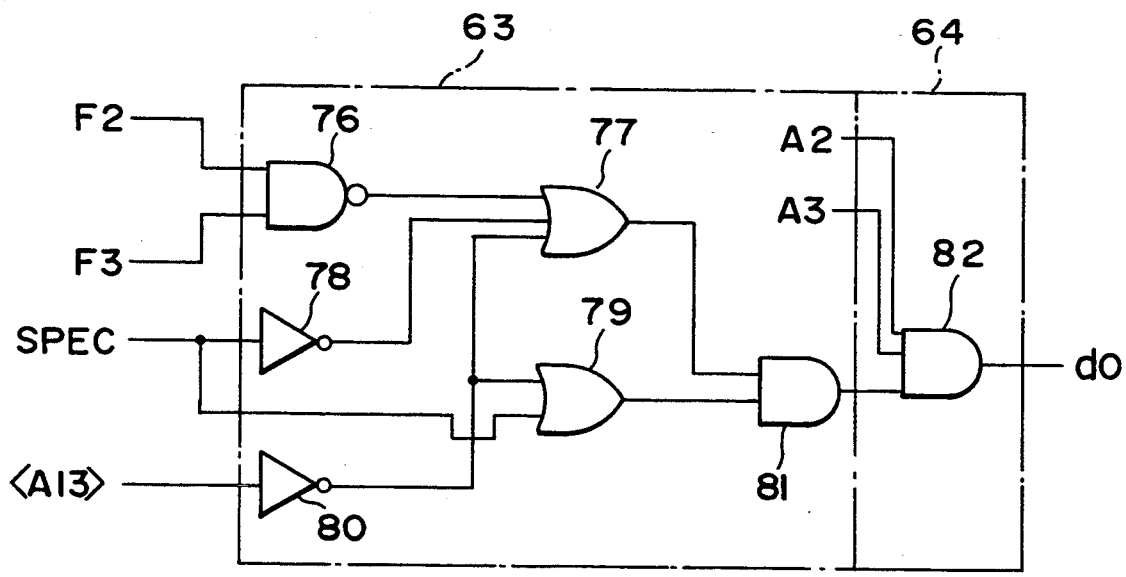
F I G. 11

| NAND GATE 71 | SPEC | ⟨A12⟩ | ⟨A13⟩ | hi |
|---|---|---|---|---|
| — | 0 | — | — | 1 |
| 0 | 1 | 0 | 0 | 1 |
| 1 | 1 | 0 | 0 | 1 |
| 0 | 1 | 0 | 1 | 1 |
| 1 | 1 | 0 | 1 | 0 |
| 0 | 1 | 1 | 0 | 0 |
| 1 | 1 | 1 | 0 | 1 |
| 0 | 1 | 1 | 1 | 1 |
| 1 | 1 | 1 | 1 | 0 |

FIRST TEST: rows 6–7
SECOND TEST: rows 8–9

FIG. 12

| NAND GATE 76 | SPEC | ⟨A13⟩ | di |
|---|---|---|---|
| 0 | 0 | 0 | 1 |
| 1 | 0 | 0 | 1 |
| 0 | 0 | 1 | 0 |
| 1 | 0 | 1 | 0 |
| 0 | 1 | 0 | 1 |
| 1 | 1 | 0 | 1 |
| 0 | 1 | 1 | 0 |
| 1 | 1 | 1 | 1 |

FIRST TEST: rows 5–6
SECOND TEST: rows 7–8

FIG. 13

SEMICONDUCTOR MEMORY HAVING REDUNDANT CELLS

TECHNICAL FIELD

The present invention relates to a semiconductor memory and more particularly to a memory having a function of performing a reliability test (drain stress test) or a burn-in test for learning data holding characteristics of drains of memory cells.

BACKGROUND ART

In an EPROM (Electrically Programmable and Erasable ROM) type of semiconductor memory, the commonly used type of memory cell is constructed from a transistor having a double-gate structure comprised of a control gate and a floating gate. To write data into this type of memory cell, a high potential (write potential VPP) is applied to each of a word line connected to the control gate and a bit line connected to the drain. The source is fixed at ground potential.

As a result of the application of the high-potential, a high electric field is produced in the neighborhood of the drain in the channel region of the memory cell, generating channel hot electrons. The hot electrons are injected into the floating gate by the high potential applied to the control gate. The hot electrons injected into the floating gate cause an increase in the threshold of the memory cell seen by the control gate, thereby allowing data to be stored.

FIG. 1 illustrates a portion of an EPROM in which a plurality of memory cells, having such a structure as described above, are arranged in an array. In FIG. 1, M1 through M4 denote memory cells, WL1 and WL2 denote word lines, BL1 and BL2 denote bit lines, 1A and 1B denote column decoders, 2 through 5 denote decode signals from the column decoders, and 6 denotes a row decoder. D1, D2, H1, and H2 denote bit line select transistors, and S denotes a transistor for writing a data in a memory cell in responsive to a predetermined signal (write transistor).

In normal write mode and read mode, in order to select one of the bit lines, the bit line select transistors D1, D2, H1, H2 are selectively driven by decode signals 2–5 from the column decoders 1A and 1B.

Suppose now that the memory cell M1 is written into. Then, the bit line BL1 and the word line WL1 are selected with the result that they are supplied with the high potential. At this time, the other memory cell M2 having its drain connected to the selected bit line BL1 and its control gate maintained at ground potential is in a nonselected state, but its drain is supplied with the high potential. If the number of memory cells connected to one bit line is N, (N−1) cells are placed in such a state. When memory cells are in such a state, electrical stress is applied to their drains. In cases where the quality of their gate oxide layers is poor, the leakage of electrons injected into their floating gates may occur, and thus data that has be written into once may be erased.

Therefore, a reliability test is made to study data holding characteristics of drains of memory cells. This test is performed by applying a high potential to the bit lines and putting the word lines in the nonselected state after all the memory cells have been written into. In order to perform the test on all the memory cells, it is required to test $2^n$ bit lines when the number of column address pins is n. If, in this case, the test were repeated for each of the bit lines, the overall test time would become extremely long. To reduce the test time, therefore, conventional EPROMs have been equipped with an internal test function. In a test mode using this internal test function, all the decode signals output from the column decoders 1A, 1B in FIG. 1 are set to a high ("H") level, and all the bit-line select transistors D1, D2, H1, H2 are simultaneously rendered conductive. Further, the drain and gate of a write transistor S is applied the high write potential VPP as in the case of the writing of data.

At this time, the gates of the memory cells M1, M2 connected to the bit line BL1 are both at ground potential, so that they are both nonconductive. The same potential is applied to the drains of the memory cells. Subsequently, a check is made for reliability. Such is also the case with other bit lines.

Consider now a case where, as shown in FIG. 2, there is a defect in the bit line BL2, for example, a defective leakage path 7 extending from the bit line to ground. In FIG. 2, memory cells are omitted for simplicity. Short-circuiting of the bit line and the drain of a memory cell to the substrate or the word line will be considered as one of the causes for the defective leakage path. EPROMs with such a leakage path are generally disposed of as defective units; however, a column redundancy circuit could make them completely operating units. That is, if fuses were programmed beforehand in such a way that, when such an address signal as to select the transistors D1 and H2 is input, a redundancy select transistor DR is selected in place of the transistors D1 and H2, the defective bit line BL2 could be replaced with a redundancy bit line BLR.

In performing the above-described stress test on such a defective EPROM, however, a leakage current path is formed which extends from the drain of the write transistor S supplied with the write potential VPP through the bit-line select transistors D1 and H2, the bit line BL2 and the defective leakage path 7 to ground. Then, the potential at a node 11′, to which the source of the transistor S is connected, will go lower than the potential at the node 11 in FIG. 1 because of voltage drop across the transistors S and D1, and parasitic resistance associated with the line connecting the transistors. Further, the potential at the node 12 in FIG. 2, to which the source of the transistor D1 is connected, will go lower than the potential at the node 11′. At the time of stress test, it is necessary that a potential equal to that at node 11 be applied to all the bit lines.

In the case of FIG. 2, however, only a potential equal to that at node 12 is applied not only to the bit line BL2 associated with the defective leakage path 7 but also to the normal bit line BL1. This will not allow memory cells connected to the bit line BL1 to be subjected to a satisfactory stress test. In FIG. 2, only two bit lines are shown connected to the node 12 for the purpose of simplifying illustration, but actually eight or sixteen bit lines are connected to the node. Thus, when the potential at the node 11′ goes lower than that at the node 11, the voltage applied to bit lines connected to the node 11′ by transistors other than the transistor D1 will become insufficient in magnitude at the time of stress test. In other words, if there were at least one bit line having such a leakage path extending to ground as described above among all the bit lines supplied with the write potential VPP through the write transistor S, applied stress to all the bit lines would become insufficient in level. This might well allow some cells to pass the stress test in spite of poor reliability of their drain data holding characteristics.

It is possible to detect a defective bit line having a leakage path to ground potential by a test and replace it with a normal column by the use of a redundancy feature. However, even if there are defective cells that were allowed to pass the stress test in spite of their poor drain data holding property because the applied stress was insufficient, they remain undetected. For this reason, EPROMs having a leakage path to ground potential are regarded as defective though they can be saved by using the column redundancy feature.

Meanwhile, such problems as described above are also encountered in performing a burn-in test on DRAMs. In the burn-in test, a potential higher than a usual power supply voltage is applied to word lines. At this time, a high electric field is applied to the gate of each memory cell, so that a gate oxide layer with poor voltage-withstanding property suffers breakdown. The word line connected to the memory cell which has suffered a breakdown in the gate oxide layer is subsequently replaced with a redundancy word line. By the way, in performing the burn-in test, a high potential supplied through an external terminal is applied to all the word lines in parallel. If, however, a leakage current path extending from a certain word line to ground is present, applied stress to all the word lines becomes an insufficient level at the time of a burn-in test as is the case with the stress test described above. For this reason, some word lines may pass the burn-in test.

As described above, the problems with EPROMs are that, if at least one defective bit line is present which is associated with a leakage path extending to ground potential, applied stress applied to all the bit lines becomes insufficient in level, some memory cells may pass the stress test in spite of their poor reliability for drain data holding property, and they are regarded as defective though they can be remedied by the use of the redundancy function.

Likewise, the problems with DRAMs are that, if at least one defective word line is present which is associated with a leakage path extending to ground potential, applied stress applied to all the word lines becomes insufficient in level, some word lines may pass the burn-in test, and they are regarded as defective though they can be remedied by the use of the redundancy function.

A first object of the present invention is to provide a semiconductor memory in which, in a stress test for checking memory cells for their reliability for drain data holding property, even if a certain bit line is defective, a normal stress potential is applied to other normal bit lines or bit lines in blocks other than a block containing the defective bit line, thereby permitting a proper check to be made for reliability.

A second object of the present invention is to provide a semiconductor memory in which, in a burn-in test for checking voltage-withstanding property of gate oxide layers of memory cells, even if a certain word line is defective, a normal stress potential is applied to other normal word lines, thereby permitting a proper burn-in test to be made.

SUMMARY OF THE INVENTION

A semiconductor memory of the present invention comprises: a memory cell array in which memory cells are placed at intersections of first lines and second lines; selecting means coupled with said second lines for selecting said second lines; potential supply means coupled with said second lines through said selecting means for applying a predetermined potential to said second lines; at least one redundancy line which, when there is a defective line among said second lines, is used for said defective line; redundancy line selecting means for, when a redundancy line is used, selecting said redundancy line; address storage means for storing an address used for replacing said defective line with said redundancy line when said redundancy line is used; and control means for, when said second lines are selected by said selecting means, controlling said selecting means to select second lines excluding said defective line whose address has been stored in said address storage means.

Also, a semiconductor memory of the present invention comprises: first lines; memory cells driven with signals on said first lines; second lines connected with corresponding ones of said memory cells; potential supply means connected with said second lines in common for applying a predetermined potential to said second lines; and control means for, when there is a defective line among said second lines, controlling said potential supply means not to apply said potential to said defective line of said second lines.

With the above arrangements, at the time of a data preserving reliability test, even if there is a second line having a defect such as a leakage path to ground potential, a stress potential can be applied only to normal ones of the second lines.

BRIEF DESCRIPTION OF THE DRAWINGS

FIG. 3 is a schematic block diagram of an EPROM according to a first embodiment of the present invention;

FIG. 4 is a circuit diagram illustrating a specific arrangement of a portion of the EPROM of FIG. 3;

FIG. 10 is a circuit diagram illustrating a specific arrangement of a portion of the EPROM of FIG. 9;

FIG. 11 is a circuit diagram illustrating a specific arrangement of a portion of the EPROM of FIG. 9;

FIG. 12 illustrates truth-value states of signals in the circuit of FIG. 11;

FIG. 13 illustrates truth-value states of signals in the circuit of FIG. 11;

DETAILED DESCRIPTION OF THE PREFERRED EMBODIMENTS

Figure 1:
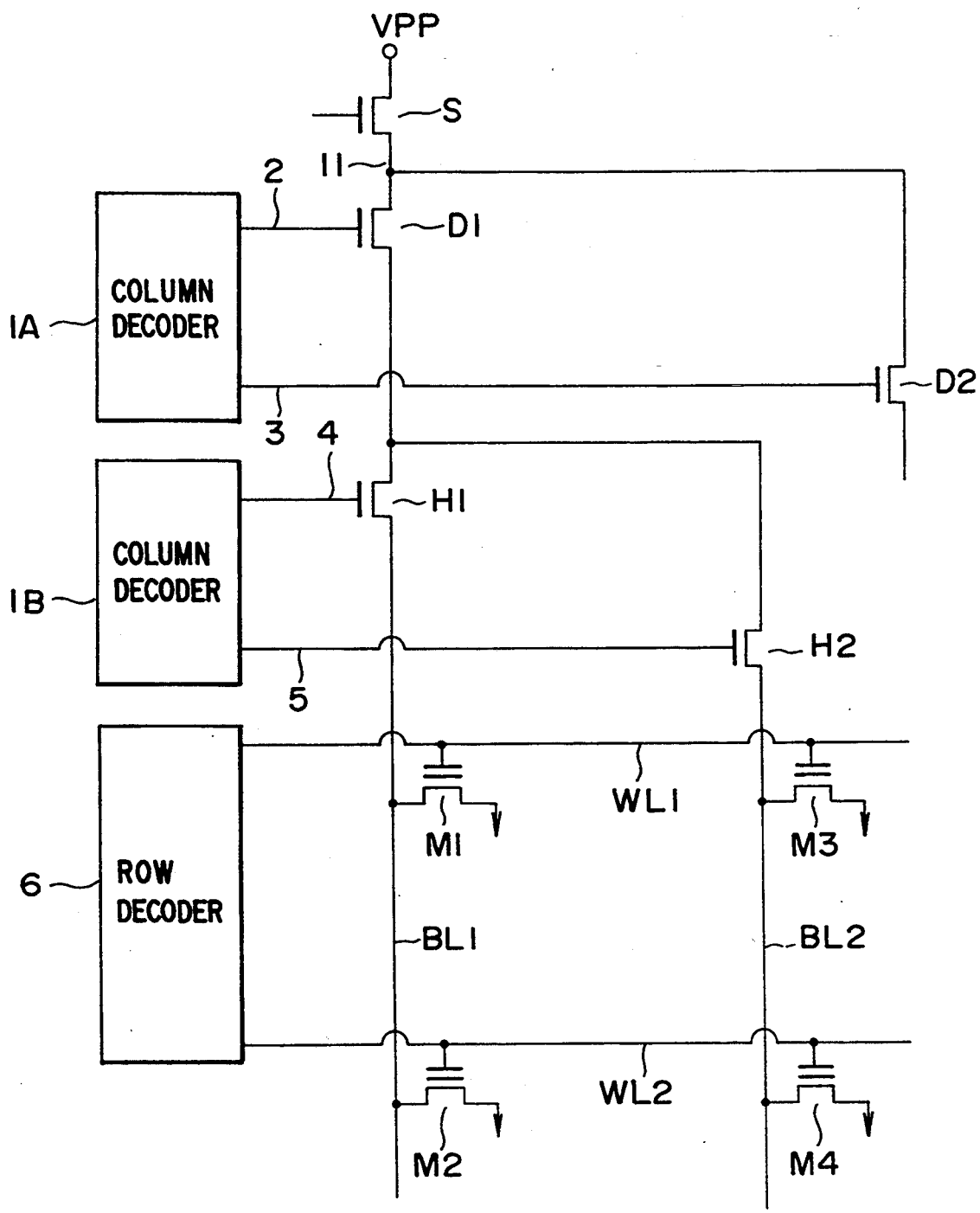
FIG. 1 is a circuit diagram of a portion of a conventional EPROM.
Figure 2:
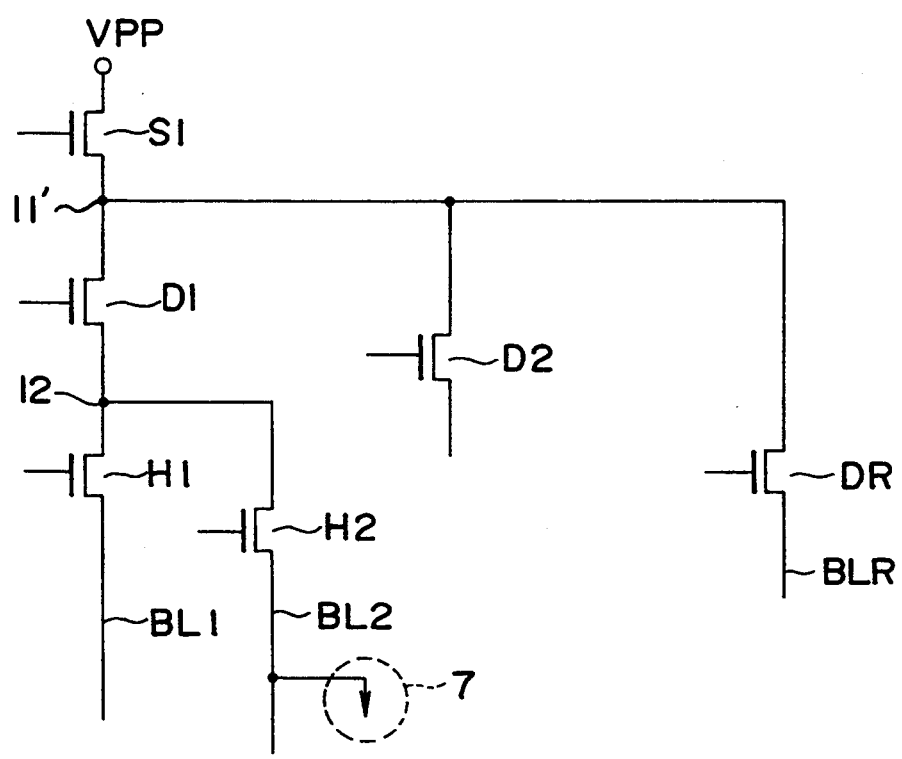
FIG. 2 is a circuit diagram of a portion of an EPROM having a defective bit line which is associated with a leakage current path to ground potential.

Hereinafter, embodiments of the present invention will be described in detail with reference to the drawings.

FIG. 3 is a block diagram of a portion of an EPROM according to a first embodiment of the present invention. In FIG. 3, 20 designates a memory cell array in which a number of memory cells M are arranged in a matrix form. In the memory cell array 20, word lines WL1 to WLm and bit lines BL1 to BLn intersect at right angles. Each memory cell M is placed at a respective one of the intersections of the word and the bit lines.

The bit lines BL1 to BLn are connected to a bit line select circuit, which selects among the bit lines. Reference numeral 22 denotes a potential supply circuit which produces a write potential to be applied to the bit lines. The potential supply circuit 22 is coupled with the bit lines BL1 to BLn through the bit line select circuit 21.

Reference numeral 23 denotes a redundancy memory cell array having two or more redundancy bit lines BLR1 to BLRi in order to replace faulty bit lines to the redundancy bit lines, if any. The redundancy memory cell array 23 has a number of redundancy memory cells M at intersections of the word lines WL1 to WLm and the redundancy bit lines BLR1 to BLRi. The redundancy bit lines BLR1 to BLRi are coupled with the potential supply circuit 22 through a redundancy select circuit 24, which selects among the redundancy bit lines BLR1 to BLRi.

Reference numeral 25 denotes a faulty-bit-line address storage circuit which, in case that there are faulty bit lines, including faulty bit lines associated with leakage paths to ground potential, among the bit lines within the memory cell array 20, stores addresses corresponding to the faulty bit lines. The storage of addresses in the storage circuit 25 may be performed by providing a number of polysilicon fuses and selectively blowing them in accordance with input data or by providing a number of nonvolatile EPROM cells and writing data into the cells. The address storage circuit 25 is connected to a control circuit 26.

The control circuit 26 is applied with an address signal for selecting among the bit lines BL1 to BLn, a test mode signal that sets a test mode in which a reliability test is made to see data holding characteristics of the memory cells, addresses stored in the address storage circuit 25. Outputs of the control circuit 26 are coupled to the bit-line select circuit 21 and the redundancy bit-line select circuit 24, so that they operate under control of the control circuit 26.

FIG. 4 illustrates detailed arrangements of the memory cell array 20, the bit-line select circuit 21 and the potential supply circuit 22 in the EPROM of FIG. 3. The memory cells M in the memory cell array 20 are each constructed from a MOS transistor with a double-gate structure comprised of a floating gate and a control gate. Each memory cell M has its drain connected to one of the bit lines BL1 to BLn, its control gate connected to one of the word lines WL1 to WLm and its source connected to a node supplied with a fixed potential, for example, ground potential.

The bit-line select circuit 21 comprises bit line select transistors H1 to Hn corresponding in number to the bit lines BL1 to BLn. The sources of the bit line select transistors H1 to Hn are connected in common, the common sources being connected to the potential supply circuit 22. The drains of the transistors H1 to Hn are connected to the bit lines BL1 to BLn, respectively. The gates of the bit line select transistors H1 to Hn are supplied with outputs of the control circuit 26.

The potential supply circuit 22 comprises a transistor S, which has its source connected to the high potential VPP, its drain connected to the common sources of the transistors H1 to Hn in the bit line select circuit 21. The high potential VPP is applied to the gate of the transistor S during a test mode.

Figure 5:
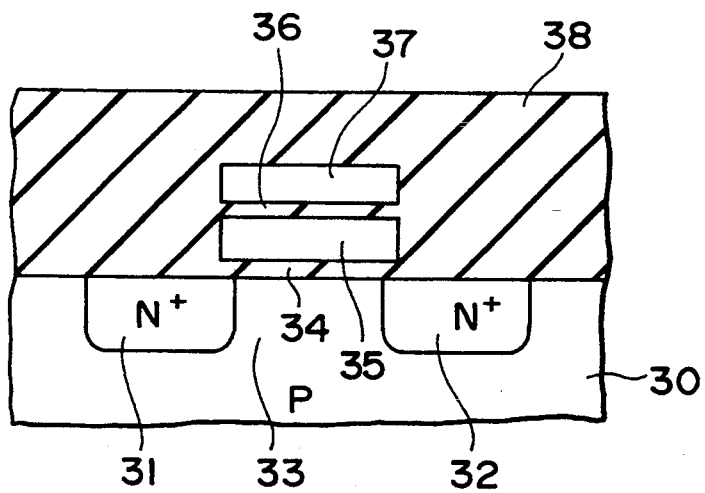
FIG. 5 is a sectional view of a memory cell of the EPROM of FIG. 3.

FIG. 5 illustrates a specific device structure when each memory cell transistor in the memory cell array 20 is an N-channel device. In FIG. 5, a source region 31 and a drain region 32, each formed of an $N^+$-type diffusion region, are formed within a surface region of a semiconductor substrate 30 of P-type conductivity. A floating gate 35 is provided on an gate insulating layer 34 located over a channel region 33 between the source region 31 and the drain region 32. Further, a control gate 37 is provided on a gate insulating layer 36 located over the floating gate 35. A passivation insulating film 38 is formed over the surface of the substrate including the dual-gate structure.

Figure 6:
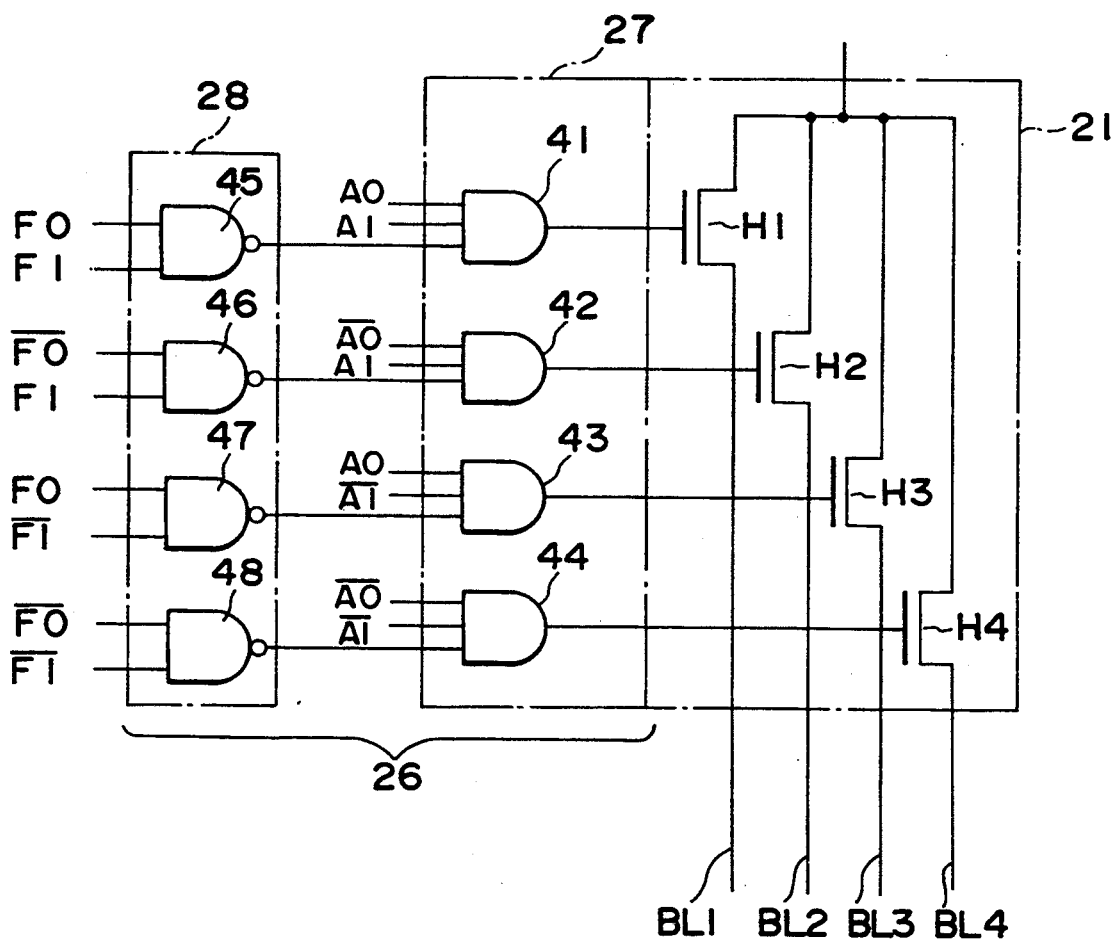
FIG. 6 is a circuit diagram illustrating a specific arrangement of a portion of the EPROM of FIG. 3.

FIG. 6 illustrates a detailed arrangement of a portion of the control circuit 26 along with the bit line select circuit 21. The control circuit 26 is illustrated taking, as an example, a case where the number of the bit lines in the memory cell array 20 is four, i.e., n=4. In this case, therefore, the bit line select circuit 21 comprises four bit-line select transistors H1 to H4. As shown, the control circuit 26 has a column decoder 27 and a column decoder 28 for test use. The column decoder 27 comprises four 3-input AND gates 41 to 44 that correspond to the four bit-line select transistors H1 to H4, respectively. Outputs of the AND gates 41 to 44 are coupled to the gates of the bit line select transistors H1 to H4, respectively. Each of the AND gates 41 to 44 is supplied with a 2-bit column bit address signal and a corresponding output of the test column decoder 28. For example, to the AND gate 41 for driving the gate of the bit line select transistor H1 are applied a 2-bit address signal of A0 and A1 and an output of the test column decoder 28. Likewise, to the AND gate 42 are applied a 2-bit address signal of A1 and /A0 and an output of the test column decoder 28. The AND gate 43 is applied with both a 2-bit address signal of A0 and /A1 and an output of the test column decoder 28. Furthermore, to the AND gate 44 are applied a 2-bit address signal of /A0 and /A1 and an output of the test column decoder 28. Each bit of the 2-bit address signals is set to a logic level corresponding to an externally applied column address signal in normal data readout and write modes; however, they are all set to logic "1" in a test mode in which the above-mentioned stress test is made.

In the test column decoder 28, there are provided four 2-input NAND gates 45 to 48 corresponding to the four bit line select transistors H1 to H4. Each of the four NAND gates 45 to 48 is applied with an address signal stored in the faulty-bit-line address storage circuit 25 in the form of a 2-bit signal. That is, F0 and F1, /F0 and F1, F0 and /F1, and /F0 and /F1 are applied to the NAND gates 45, 46, 47, and 48, respectively.

The control circuit 26 has a function which, when supplied with a column address signal for selecting a specific faulty bit line in the memory cell array 20 during normal data write and readout modes, controls the redundancy bit-line select circuit 24 to select one of the redundancy bit lines BLR1 to BLRi in the redundancy memory cell array 23 in place of the faulty bit line. The redundancy feature in normal data readout and write modes is well known to those in the art, and thus the arrangement therefor is omitted.

In the memory constructed as described above, in case that there is a faulty bit line having a leakage path to ground potential among the bit lines of the memory cell 20 prior to the execution of the stress test, the address corresponding to the faulty bit line is stored in the address storage circuit 25. For example, in FIG. 3, when the bit line BL1 is associated with a leakage path, the address corresponding to the bit line BL1 is stored in the faulty-bit-line address storage circuit 25.

When the test mode signal applied to the control circuit 26 is set to the test state in order to make the drain stress test, the drain stress test is started. At this time, F0 and F1 corresponding to the faulty bit line BL1 and output from the address storage circuit 25 are each set to "1" with the result that the output of the NAND gate 45 goes to "0". In this case, at least one of the two bits applied to each of the three NAND gates 46 to 48 goes to "0", so that the outputs of the NAND gates 46 to 48 all go to "1". Meanwhile, A0, /A0, A1, and /A1 are all set to "1" at the time of the drain stress test. Thus, of the four AND gates 41 to 44 in the column decoder 27, only the output of the AND gate 41 goes to "0", while the outputs of the remaining AND gates 42 to 44 all go to "1". Thereby, of the four bit-line select transistors H1 to H4 in the bit line select circuit 21, the transistor H1 connected to the faulty bit line BL1 is turned off, while the three remaining transistors H2 to H4 connected to the fault-free bit lines BL2 to BL4 are turned on.

At the time of the drain stress test, the high potential VPP is applied to the source and the gate of the transistor S of the potential supply circuit 22. Thus, the high potential VPP is applied to all the bit lines except the faulty bit line BL1, that is, to the bit lines BL2 to BL4, as a stress potential.

Thus, in the present embodiment, drain stress can be applied to the bit lines excluding a faulty bit line at the time of drain stress test.

Although description has not been made particularly, in the above embodiment, the drain stress is also applied to the redundancy bit lines BLR1 to BLRi in the redundancy memory cell array 23.

In addition, even if such a column address signal as selects the faulty bit line BL1 is applied during normal data write and read modes, the output of the AND gate 41 in the column decoder 27 goes to "0", failing to select the faulty bit line BL1. In place of the faulty bit line BL1, one of the redundancy bit lines BLR1 to BLRi in the redundancy memory cell array 23 is selected.

Figure 7:
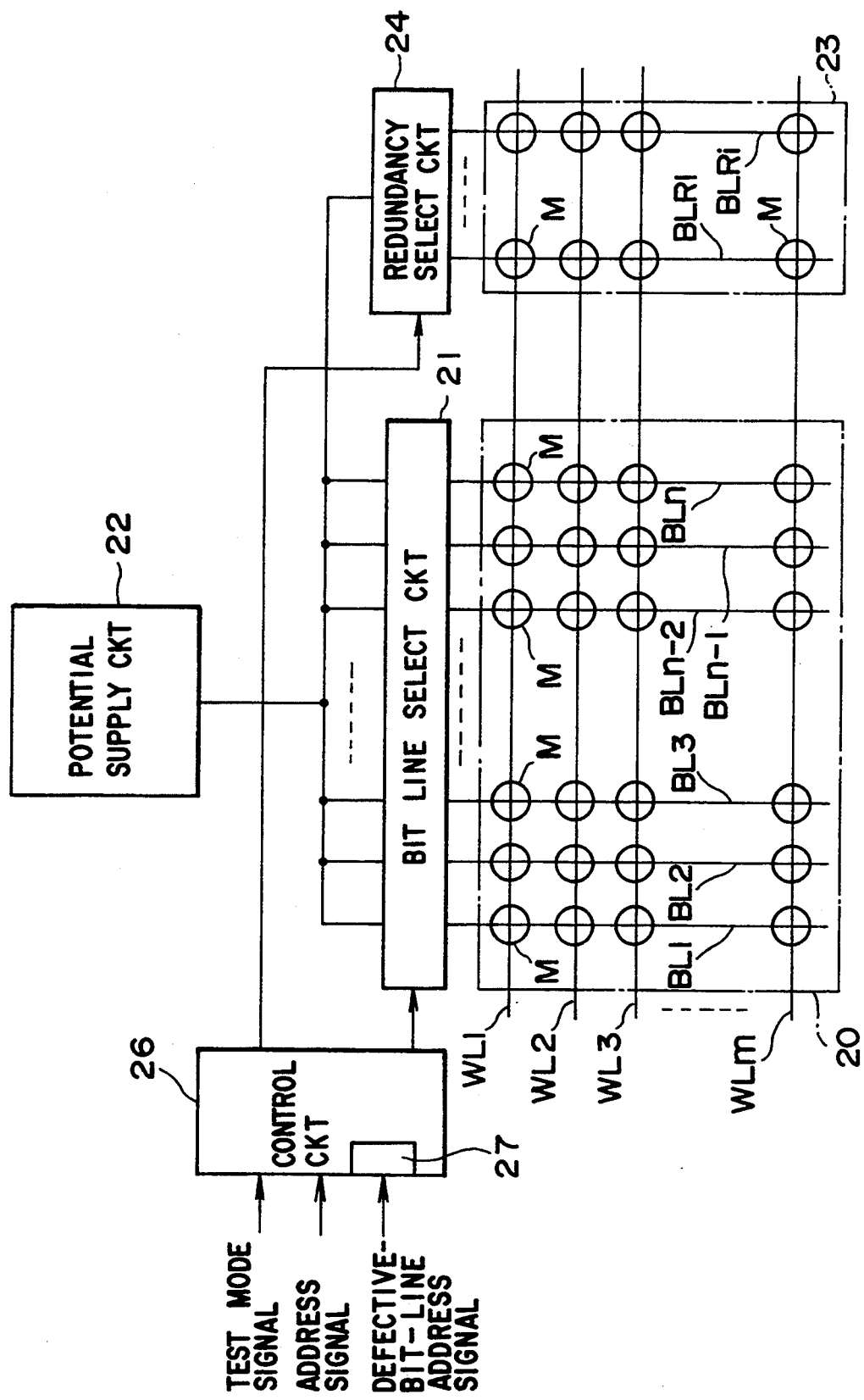
FIG. 7 is a schematic block diagram of an EPROM according to a second embodiment of the present invention.

FIG. 7 is a block diagram illustrating a portion of an EPROM according to a second embodiment of the present invention. The EPROM of the second embodiment is distinct from the EPROM of the first embodiment shown in FIG. 3 in that the signals F0, /F0, F1, /F1, etc. are applied to the control circuit 26 from outside of the memory without provision of the address storage circuit 25. In this case, the control circuit has a built-in latch circuit 27 which latches those signals.

Figure 8:
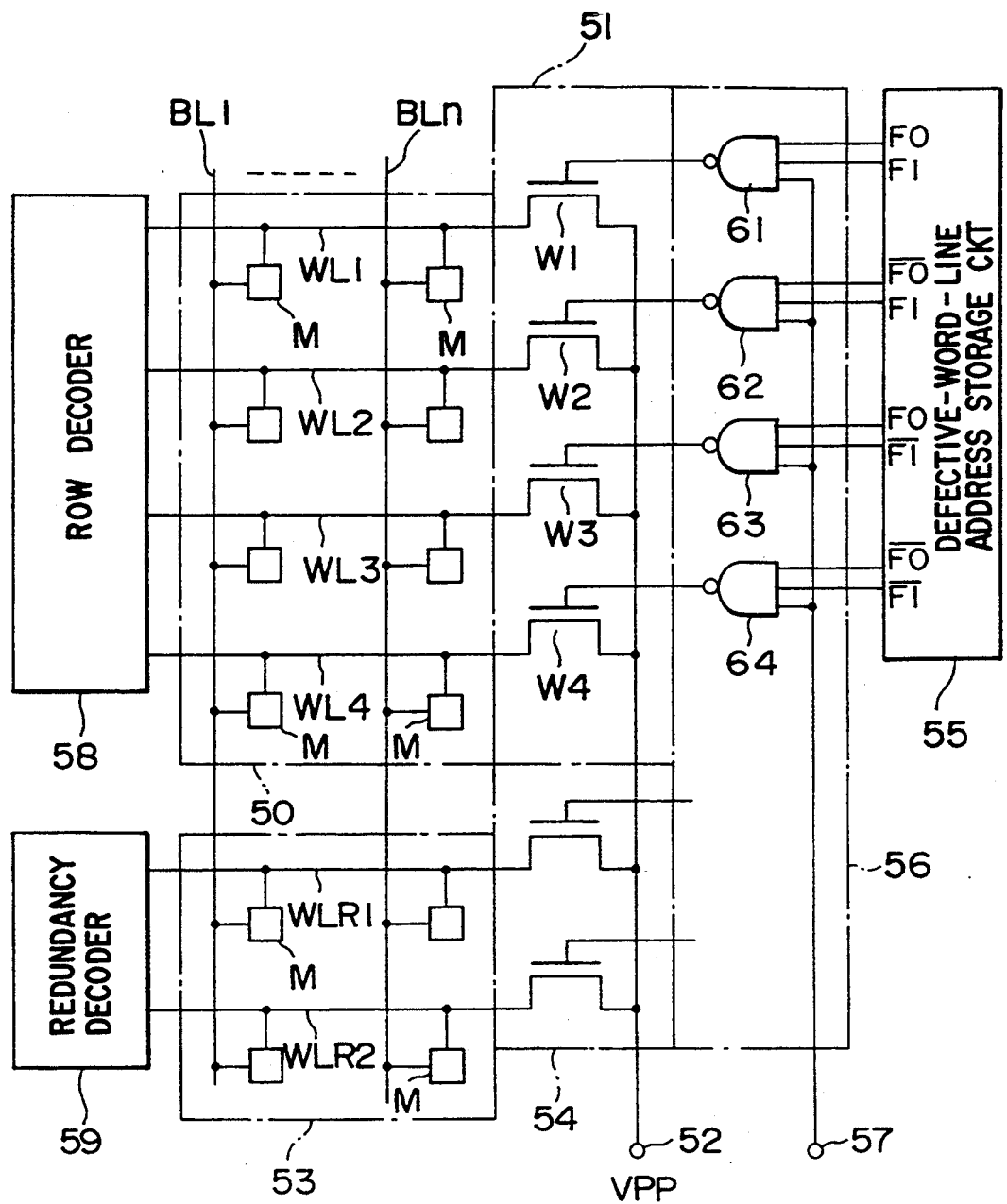
FIG. 8 is a schematic circuit diagram of a DRAM according to a third embodiment of the present invention.

FIG. 8 is a block diagram illustrating a third embodiment of the present invention which is directed to a DRAM. In FIG. 8, 50 denotes a memory cell array in which a number of dynamic memory cells are arranged in a matrix form. In the memory cell array 50, a number of, for example, four, word lines WL1 to WL4 and a number of bit lines BL1 to BLn intersect at right angles, and each of the memory cells M is placed at a respective one of the intersections of the word lines WL1 to WL4 and the bit lines BL1 to BLn.

The four word lines WL1 to WL4 are connected to a world line select circuit 51. The word line select circuit 51 selects among the four word lines WL1 to WL4. Reference numeral 52 denotes a potential supply terminal to which a high potential VPP is supplied for application to the word lines WL1 to WL4 at the time of a burn-in test. The potential supply terminal 52 is coupled with the four word lines WL1 to WL4 through the word line select circuit 51.

Reference numeral 53 denotes a redundancy memory cell array having two or more redundancy word lines, for example, two redundancy word lines WLR1 and WLR2, that are used for faulty word lines among the four word lines WL1 to WL4, if any. The redundancy memory cell array 53 has a number of redundancy memory cells M that are placed at the intersections of the word lines WLR1, WLR2 and the bit lines BL1 to BLn. The redundancy word lines WLR1 and WLR2 are coupled with the potential supply terminal 52 through a redundancy word line select circuit 54, which selects between the redundancy word lines WLR1 and WLR2.

Reference numeral 55 denotes a faulty-word-line address storage circuit which, when there are faulty word lines with leakage paths to ground potential among the four word lines within the memory cell array 50, stores addresses corresponding to the faulty word lines. The storage of addresses in the storage circuit 55 may be performed by providing a number of fuses and selectively blowing them in accordance with input data. The address storage circuit 55 is connected to a control circuit 56.

The control circuit 56 is applied with a test mode signal that sets a test mode for the burn-in test from a test terminal 57 as well as addresses stored in the address storage circuit 55. Outputs of the control circuit 56 are coupled to the word line select circuit 51 and the redundancy word-line select circuit 54, so that they operate under control of the control circuit 56.

Reference numeral 58 denotes a row decoder which selects among the four word lines WL1 to WL4 at the time of normal data write and readout operations, and 59 denotes a redundancy row decoder which selects between the redundancy word lines WLR1 and WLR2 in using the redundancy feature.

The word line select circuit 51 comprises four word line select transistors W1 to W4 corresponding to the word lines WL1 to WLn. The sources of the word line select transistors W1 to W4 are connected in common, the common sources being connected to the potential supply terminal 52. The drains of the transistors W1 to W4 are connected to the word lines WL1 to WL4, respectively. The gates of the word line select transistors W1 to W4 are supplied with outputs of the control circuit 56.

In the control circuit 56, there are provided four 3-input NAND gates 61 to 64 corresponding to the four word line select transistors W1 to W4. Each of the four NAND gates 61 to 64 is applied with an address stored in the faulty-word-line address storage circuit 55 in the form of a 2-bit signal and the test mode signal. That is, in addition to the test mode signal, F0 and F1, /F0 and F1, F0 and /F1, and /F0 and /F1 are applied to the NAND gates 61, 62, 63, and 64, respectively.

In the memory constructed as described above, in case that there is a faulty bit line having a leakage path to ground potential among the bit lines of the memory cell 50 prior to the execution of the burn-in test, the address corresponding to the faulty word line is stored in the address storage circuit 55. For example, in FIG. 8, when the word line WL1 is associated with a leakage path, the address corresponding to the word line WL1 is stored in the faulty-word-line address storage circuit 55.

When the test mode signal applied to the control circuit 56 is set to the test state in order to make the burn-in test, the burn-in test is started. At this time, F0 and F1, in the 2-bit address signal corresponding to the faulty bit line BL1 and output from the address storage circuit 55, are each set to "1" with the result that the output of the NAND gate 61 goes to "0". In this case, at least one of the two bits applied to each of the three other NAND gates 62 to 64 goes to "0", so that the outputs of the NAND gates 62 to 64 all go to "1". Thereby, of the four word line select transistors W1 to W4 in the word line select circuit 51, the transistor W1 connected to the faulty word line WBL1 is turned off, while the three remaining transistors W2 to W4 connected to the fault-free word lines WL2 to WL4 are turned on.

At the time of the burn-in test, the high potential VPP is applied to the potential supply point 52. Thus, the high potential VPP is applied to all the word lines except the faulty word line WL1, that is, to the word lines WL2 to WL4.

Thus, in the present embodiment, the stress potential can be applied to the word lines excluding a faulty word line at the time of the burn-in test.

In the memory of FIG. 8 as well, the stress potential is applied to the redundancy word lines WLR1 to WLR2 in the redundancy memory cell array 53 at the time of burn-in test. As in the embodiment shown in FIG. 7, the embodiment of FIG. 8 may be arranged such that the signals F0, /F0, F1, and /F1 are applied to the control circuit 56 from outside of the memory without provision of the address storage circuit 55.

Figure 9:
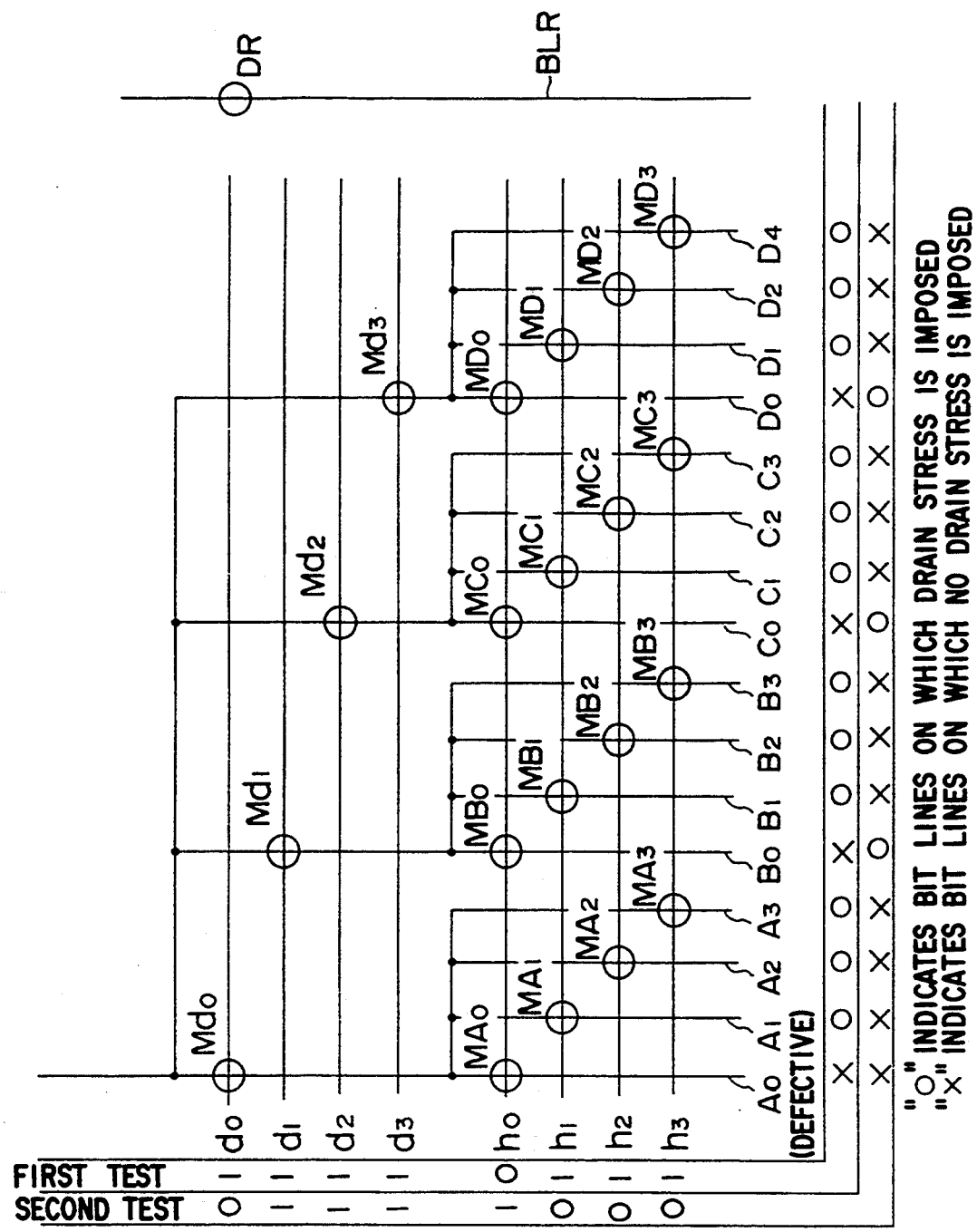
FIG. 9 is a schematic circuit diagram of an EPROM according to a fourth embodiment of the present invention.

FIG. 9 is a circuit diagram of the bit line select circuit 21 of FIG. 3 in an EPROM according to a fourth embodiment of the present invention. In the EPROM according to this embodiment, the bit line select circuit 21 has a multistage tree structure. For the purpose of simplifying illustration, there are illustrated a total of 16 bit lines, A0 to A3, B0 to B3, C0 to C3, and D0 to D3, having a two-stage tree structure in which, at each stage, four lines branch out from a line, first-stage bit line select transistors Md0 to Md3 which are selected by column decode outputs di (i=0−3), second-stage bit line select transistors MA0 to MD0, MA1 to MD1, MA3 to MD3, and MA3 to MD3 which are selected by column decode outputs hi (i=0−3), a redundancy bit line BLR, and a redundancy bit line select transistor Dr. It is assumed that the number of faulty bit lines having a leakage path to ground potential is one. Bit lines that are supplied with drain stress are marked with O; while bit lines that are not supplied with drain stress are marked with X. This embodiment, like the embodiment of FIG. 3, is provided with the memory cell array 20, the dummy memory cell array 23, the redundancy select circuit 24, the faulty-bit-line address storage circuit 25, and the control circuit 26.

Consider now that the bit line A0 selected by the column decode outputs d0, h0 is faulty because it has a leakage path to ground, and it is replaced with the redundancy select transistor DR. In this case, the drain stress test is performed in accordance with the following sequence.

The first time: d0 to d3, h1 to h3=1, h0=0
The second time: d0, h1 to h3=0, d1 to d3, h0=1

From FIG. 9 it will be appreciated that the above-mentioned test permits application of the stress potential to bit lines other than the faulty bit line, and moreover each bit line has only to be subjected to the stress only once. In the above sequence, the column decoder outputs di and hi can be replaced with each other to expect the same effects.

FIGS. 10 and 11 are detailed circuit diagrams of portions of the control circuit 26 for use with the circuit of FIG. 9. In the EPROM with redundancy feature, addresses corresponding to a faulty bit lines are stored in the address storage circuit 25. The stored addresses can produce column decode outputs di and hi that are to be set to "0". Exemplary arrangements of control circuits for hi and di are illustrated in FIGS. 10 and 11. Truth-value states of the control circuits are illustrated in FIGS. 12 and 13, respectively.

FIG. 10 illustrates a portion of the control circuit 26 which produces the column decode output h0. This circuit comprises a test circuit 61 and a column decode circuit 62. Thus, with the FIG. 9 circuit, the control circuit 26 is provided with a total of four such circuits as shown in FIG. 10.

FIG. 11 illustrates a portion of the control circuit 26 which produces the column decode output d0. This circuit comprises a test circuit 63 and a column decode circuit 64. Thus, with the FIG. 9 circuit, the control circuit 26 is provided with a total of four such circuits as shown in FIG. 11.

This embodiment uses two types of test mode signals for subjecting the EPROM to the drain stress test. The first type comprises <A12> and <A13>. <A12> and <A13> are signals that are output by applying to an input pin or an output pin that is not used in the drain stress test mode a three-valued control input, which is at a high potential during the test mode and, at other times, at 0 to 5 V, and then detecting the three-valued control input by a three-valued input detector within a chip. That is, when a high potential of, for example, 12 V is applied to each of address input terminals A12 and A13, each of the <A12> and <A13> goes to "1". The other test mode signal is a signal SPEC, which indicates whether or not the redundancy feature is used. When the redundancy feature is used, the signal SPEC is "1". The signal may be externally applied to the chip as a three-valued control input like the <A12> and <A13> or may be stored beforehand, as fuse data, in the address storage circuit 25.

FI (I=0−3) is an output of the address storage circuit 25. A0 to A3 are column address signals. These signals are inverted, depending upon circuits to which they are applied. For example, to the test circuit 61 for outputting h1 not shown are applied /F0 and F1 as signals based on fuse data. To the column decode circuit 62 are applied /A0 and A1 as column address signals. A signal based on fuse data is, for example, "1" when a corresponding fuse is blown out.

The test circuit 61 is arranged as follows. That is, signals F0 (or its complement) and F1 (or its complement), which are based on fuse data, are applied to a NAND gate 71 whose output is input to an Exclusive NOR gate 72. The signal <A13> is input to the Exclusive NOR gate 72. The signals <A12> and <A13> are input to an OR gate 73. Outputs of the Exclusive NOR gate 72 and the OR gate 73 are input to a NAND gate 74 together with the signal SPEC.

On the other hand, the column decode circuit 62 comprises an AND gate 75, to which the column address signals A0 (or its complement) and A1 (or its complement) and the output of the test circuit 61 are applied.

The test circuit 63 is arranged as follows. That is, signals F2 (or its complement) and F3 (or its complement), which are based on fuse data, are applied to a NAND gate 76 whose output is input to an OR gate 77. The signal SPEC is input to the OR gate 77 via an inverter 78. The signal SPEC is also input to an OR gate 79. The signal <A13> is input to the OR gates 77 and 79 via an inverter 80. Outputs of the OR gates 77 and 79 are input to an AND gate 81.

On the other hand, the column decode circuit 64 comprises an AND gate 82, to which the column address signals A2 (or its complement) and A3 (or its complement) and the output of the test circuit 63 are applied.

Therefore, the state where the output of the NAND gate 71 receiving the signals F0 and F1 (or their complement) based on fuse data or the output of the NAND gate 76 receiving the signals F2 and F3 (or their complement) based on fuse data is "0" means that the column decode output hi (i=0−3) or di (i=0−3) corresponding to the fuse data is associated with a faulty bit line.

The first test is made possible by applying input signals such that <A12>="1" and <A13>="0". At this time, all the column decode outputs di become "1". The column decode output hi becomes "0" when the output of the corresponding NAND gate 71 is "0" (the case where an associated bit line is faulty) and "1" when the output of the corresponding NAND gate 71 is "1" (the case where associated bit lines are not faulty), satisfying the column decode output conditions as described above, d0−d3, h1−h3="1", h0="0".

The second test is made possible by applying input signals such that <A12>="1" and <A13>="1". At this time, the column decode output di becomes "0" when the output of the corresponding NAND gate 76 is "0" (the case where an associated bit line is faulty) and "1" when the output of the corresponding NAND gate 76 is "1" (the case where the associated bit lines are normal), and the column decode output hi becomes "1" when the output of the corresponding NAND gate 71 is "0" (the case where an associated bit line is faulty) and "0" when the output of the corresponding NAND gate 71 is "1" (the case where the associated bit lines are normal), satisfying the column decode output conditions as described above, d0, h1−h3="0", d1−d3, h0="1".

The use of the control circuit 26 having the test circuits and the column decode circuits as shown in FIGS. 10 and 11 could permit only bit lines associated with the column decode output di, including a faulty bit line, to receive no stress potential in the state where the redundancy feature is not used (the signal SPEC is "0"), that is, fuses are not blown out because the column decode output is "1" at all times, and the column decode output di can be controlled by the three-valued-control-input-detected signal <A13>.

Figure 14:
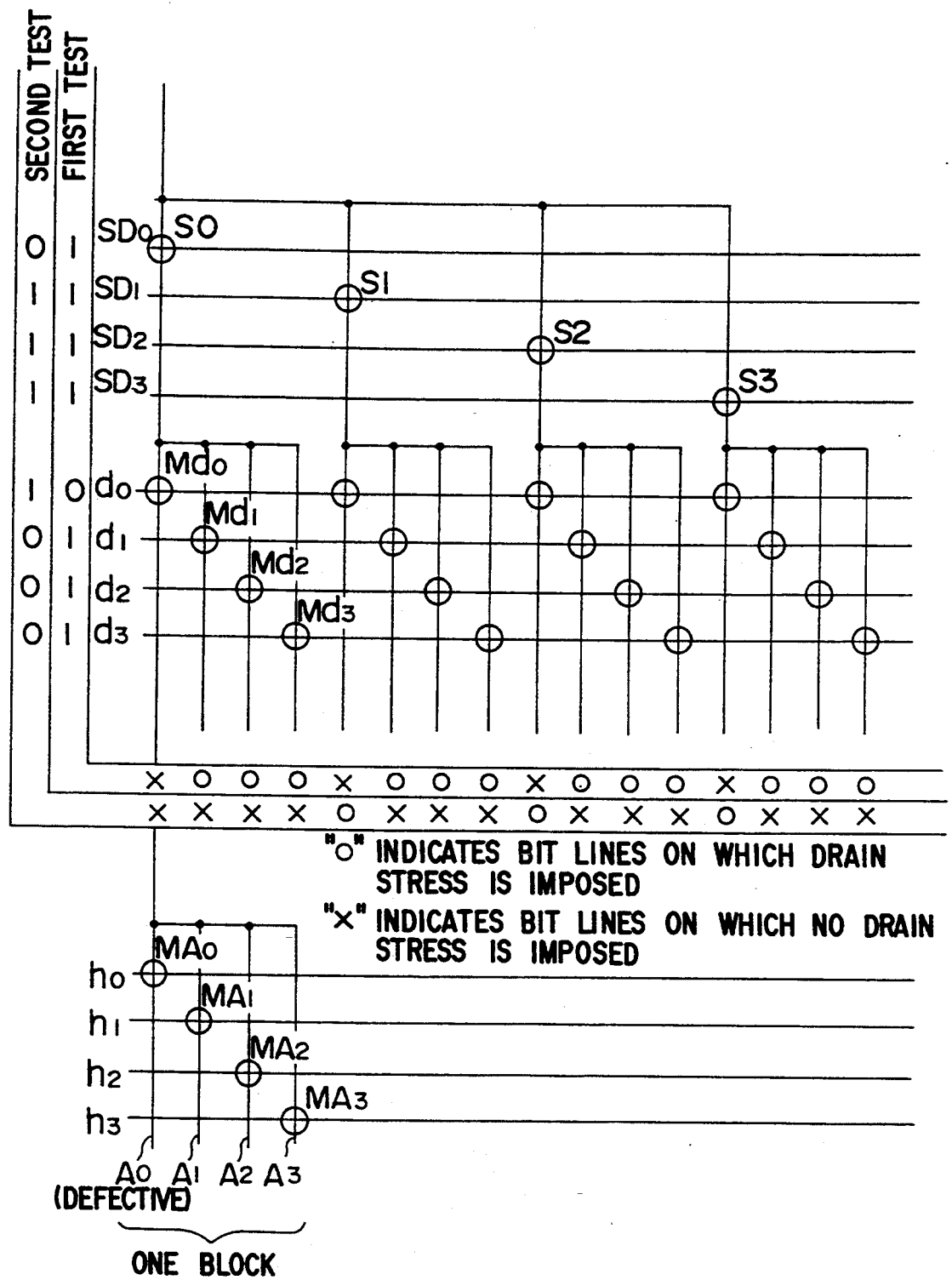
FIG. 14 is a schematic circuit diagram of an EPROM according to a fifth embodiment of the present invention.

Next, in FIG. 14, there is illustrated, as a fifth embodiment which is useful when faulty bit lines are produced in a group, a circuit arranged such that a stress potential is applied to blocks having only normal bit lines, excluding blocks having faulty bit lines.

In FIG. 14, S0 to S3 denote write transistors supplied with SDi. The other parts are the same as those in FIG. 9, and like reference characters are used therefor.

This circuit handles bit lines selected by the column decode outputs di in blocks, and thus the column decode outputs hi need not to be considered. A block having a faulty bit line is replaced by a redundancy block.

Comparison of the fifth embodiment with the fourth embodiment of FIG. 9 shows that the column decode outputs di are replaced with the write data SDi, and the column decode outputs hi are replaced with the column decode outputs di.

The above way of thinking is applicable to a case where there are two or more faulty bit lines.

Next, consider a case where there are two faulty bit lines. In this case, various cases will be considered, depending upon where the two faulty bit lines are present.

(a) A case where the two faulty bit lines are present in the same block.

(b) A case where the two faulty bit lines are present in different blocks, but they are selected by the same column decode output hi.

(c) A case where the two faulty bit lines are present in different blocks and moreover they are selected by different column decode outputs hi.

Figure 15:
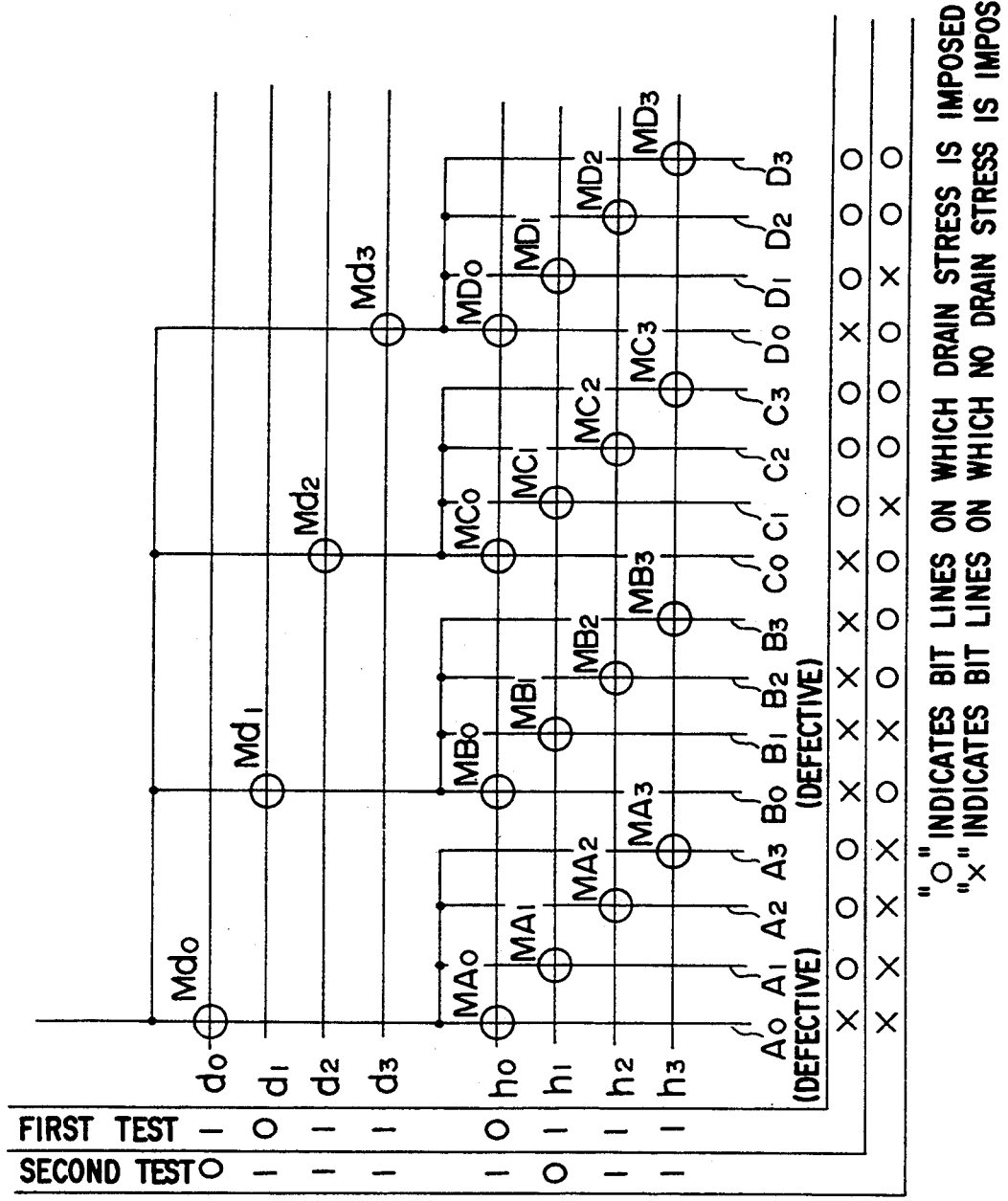
FIG. 15 is a schematic circuit diagram of an EPROM according to a sixth embodiment of the present invention.

In FIG. 15, there is illustrated a circuit according to a sixth embodiment that is useful for the above case (c).

In the circuit of FIG. 15, like reference characters are used to denote like parts in FIG. 9. In this circuit, application, to column decode outputs (di, hi) corresponding to the faulty bit lines, of "0" and "1" (or "1" and "0") as the first test input and of "1" and "0" (or "0" and "1") as the second test input permits normal bit lines to be subjected to a stress test without application of a stress voltage to the faulty bit lines. In this case, the same algorithm can be used to input signals on the basis of data to two redundancy bit lines. Moreover, the test has only to be performed two times. The stress test can be performed in the same way for the cases (a) and (b). Setting of a test mode can be considered by extending the case where only one bit line is faulty.

In the above embodiment, the location of a bit line that can be remedied is the same in each of cell blocks within a chip. If the location of a bit line that can be remedied by redundancy feature were changed independently for each block, the rate of remedy for faults occurring at random could be improved. The combination of this method with the fourth embodiment or the fifth embodiment could apply a stress potential independently to each of blocks.

Industrial Applicability

According to the present invention, as described above, a semiconductor memory can be realized which, even if a certain bit line is defective when performing a stress test for checking data holding reliability of drains of memory cells in an EPROM, can apply a normal stress potential to normal bit lines other than the defective bit line or normal bit lines in blocks other than a block having the defective bit line, thereby permitting the reliability check to be made properly.

That is, with the advance of semiconductor process techniques, the packing density of semiconductor integrated circuits has become increasingly high. The microminiaturization of integrated circuits has increased wiring-related faults. When a faulty bit line having a leakage path to ground potential, as dealt with by the present invention, is present in chips, a conventional drain stress test fails to apply an adequate stress potential to some normal bit lines. Thus, such chips have been treated as defective. Such bit-line faults amounts to the half of faults related to bit lines. Thus, it becomes very important to remedy the faults. The present invention allows application of a stress potential to normal bit lines without applying the stress potential to defective bit lines or to normal bit lines in blocks without applying the stress potential to blocks having defective bit lines, thus permitting chips having defective bit lines with a leakage path to ground potential to be remedied. By dividing a chip and changing locations that can be remedied by the redundancy feature independently for each of divisions, it has been made possible to deal with defects occurring randomly.

Furthermore, according to the present invention, a semiconductor memory can be realized which, even if a defective word line is present when performing a burn-in test on DRAMs, can apply a normal high potential to normal word lines, thereby performing the burn-in test properly.

We claim:

1. A semiconductor memory comprising:
   a memory cell array including memory cells at intersections of first lines and second lines;
   selecting means coupled with said second lines for selecting said second lines;
   potential supply means coupled with said second lines through said selecting means for applying a predetermined potential to said second lines;
   at least one redundancy line for use when a defective line is among said second lines, to replace said defective line;
   redundancy line selecting means for selecting said redundancy line when said redundancy line is to be used;
   address storage means for storing an address of said defective line to be replaced with said redundancy line when said redundancy line is used; and
   control means for controlling said selecting means by generating a selecting signal in accordance with said address stored in said address storage means to concurrently select all of said second lines excluding said defective line based on the selecting signal, said controlling means also controlling said redundancy line selecting means when said redundancy line is used.

2. A semiconductor memory comprising:
   first lines;
   memory cells driven with signals on said first lines;
   second lines connected with corresponding ones of said memory cells;
   selecting means coupled with said second lines for selecting said second lines;
   potential supply means connected with said second lines in common for applying a predetermined potential to all of said second lines; and
   control means for controlling said selecting means, when a defective line is among said second lines, by generating a selecting signal so as not to apply said potential from said potential supply means to said defective line of said second lines based on the selecting signal, said controlling means also controlling a redundancy line selecting means when a second line is defective.

3. A semiconductor memory comprising:
   a memory cell array including memory cells at intersections of first lines and second lines;
   selecting means coupled with said second lines for selecting a plurality of said second lines in parallel;
   potential supply means coupled with said second lines through said selecting means for applying a predetermined potential to said second lines;
   at least one redundancy line for use when a defective line is among said second lines, to replace said defective line;
   redundancy line selecting means for selecting said redundancy line when said redundancy line is to be used;
   address storage means for storing an address of said defective line to be replaced with said redundancy line when said redundancy line is used for said defective line; and
   control means for controlling said selecting means, when said plurality of second lines are selected in parallel by said selecting means, by generating a selecting signal in accordance with said address stored in said address storage means to concurrently select all of said plurality of second lines excluding said defective line based on the selecting signal, said controlling means also controlling said redundancy line selecting means when said redundancy line is used.

4. A semiconductor memory according to claim 1, in which said control means has an operation mode that controls said selecting means to select said second lines excluding said defective line whose address has been stored in said address storage means.

5. A semiconductor memory according to claim 4, in which said operation mode is a test mode other than a normal data readout mode.

6. A semiconductor memory comprising:
   a memory cell array including memory cells at intersections of first lines and second lines;
   selecting means coupled with said second lines for selecting said second lines;
   potential supply means coupled with said second lines through said selecting means for applying a predetermined potential to said second lines;
   at least one redundancy line for use when a defective line is among said second lines, to replace said defective line;
   redundancy line selecting means for selecting said redundancy line when said redundancy line is to be used;
   address storage means for storing an address of said defective line to be replaced with said redundancy line when said redundancy line is used; and
   control means for controlling said selecting means, when said second lines are selected by said selecting means during one of a plurality of operating modes including a test mode other than a normal readout mode, by generating a selecting signal in accordance with said address stored in said address storage means to concurrently select all of said second lines excluding said defective line based on the selecting signal, said controlling means also controlling said redundancy line selecting means when said redundancy line is used.

7. A semiconductor memory comprising:
a memory cell array including memory cells at intersections of first lines and second lines;
selecting means coupled with said second lines for selecting said second lines;
potential supply means coupled with said second lines through said selecting means for applying a predetermined potential to said second lines;
at least one redundancy line for use when a defective line is among said second lines, to replace said defective line;
redundancy line selecting means for selecting said redundancy line when said redundancy line is to be used; and
control means for controlling said selecting means, when said redundancy line is used and said defective line is selected by said selecting means on the basis of an address signal used for replacing said defective line with said redundancy line, by generating a selecting signal to select all of said second lines excluding said defective line based on the selecting signal during one of a plurality of operating modes including a test mode other than a normal readout mode, said controlling means also controlling said redundancy line selecting means when said redundancy line is used.

8. A semiconductor memory comprising:
a memory cell array including memory cells at intersections of first lines and second lines;
selecting means coupled with said second lines for selecting said second lines;
potential supply means coupled with said second lines through said selecting means for applying a predetermined potential to said second lines;
at least one redundancy line for use when a defective line is among said second lines, to replace said defective line;
redundancy line selecting means for selecting said redundancy line when said redundancy line is to be used; and
control means for controlling said selecting means, when said redundancy line is used and said defective line is selected by said selecting means on the basis of an address signal used for replacing said defective line with said redundancy line, by generating a selecting signal to concurrently select all of said second lines excluding said defective line based on the selecting signal, said controlling means also controlling said redundancy line selecting means when said redundancy line is used.

9. A semiconductor memory according to claim 8, in which said control means has an operation mode that controls said selecting means to select said second lines excluding said defective line which is designated by said address signal.

10. A semiconductor memory according to claim 9, in which said operation mode is a test mode other than a normal data readout mode.

11. A semiconductor memory according to any one of claims 8 to 10, in which said second lines are bit lines.

12. A semiconductor memory according to any one of claims 8 to 10, in which each of said memory cells comprises a source region, a drain region, a floating gate formed over a channel region between said source region and said drain region, and a control gate formed over said floating gate, said memory cells storing data in accordance with a quantity of charges stored on said floating gate.

13. A semiconductor memory comprising:
a memory cell array including memory cells at intersections of word lines and bit lines, each of said memory cells comprising a source region, a drain region, a floating gate formed over a channel region between said source region and said drain region, and a control gate formed over said floating gate, and storing data in accordance with a quantity of charges stored on said floating gate;
bit-line selecting means coupled with said bit lines for selecting said bit lines;
potential supply means coupled with said bit lines through said bit-line selecting means for applying a predetermined potential to said bit lines;
at least one redundancy line for use when a defective line is among said bit lines, to replace said defective bit line;
redundancy line selecting means for selecting said redundancy line when said redundancy line is to be used;
address storage means for storing an address used for replacing said defective bit line with said redundancy line when said redundancy line is used; and
control means for controlling said bit-line selecting means, when said bit lines are selected in parallel by said bit-line selecting means in a test mode other than a normal data readout mode, by generating a selecting signal in accordance with said address stored in said address storage means to concurrently select all of said bit lines excluding said defective bit line based on the selecting signal.

14. A semiconductor memory comprising:
word lines;
memory cells driven with signals on said word lines, each of said memory cells comprising a source region, a drain region, a floating gate formed over a channel region between said source region and said drain region, and a control gate formed over said floating gate, and storing data in accordance with a quantity of charges stored on said floating gate;
bit lines each connected with corresponding ones of said memory cells;
selecting means coupled with said bit lines for selecting said bit lines;
potential supply means connected with said bit lines in common for applying a predetermined potential to all of said bit lines; and
control means for controlling said selecting means, when a defective bit line among said bit lines in a test mode other than a normal data readout mode, by generating a selecting signal so as not to apply said potential from said potential supply means to said defective bit line based on the selecting signal.

15. A semiconductor memory according to claim 2, in which said control means has an operation mode that controls said selecting means to select said second lines excluding said defective line whose address has been stored in said address storage means.

16. A semiconductor memory according to claim 3, in which said control means has an operation mode that controls said selecting means to select said second lines excluding said defective line whose address has been stored in said address storage means.

17. A semiconductor memory according to claim 15, in which said operation mode is a test mode other than a normal data readout mode.

18. A semiconductor memory according to claim 16 in which said operation mode is a test mode other than a normal data readout mode.

19. A semiconductor memory according to any one of claims 1 to 5, or 15 to 18 in which said second lines are bit lines.

20. A semiconductor memory according to any one of claims 1 to 5, or 15 or 18 in which each of said memory cells comprises a source region, a drain region, a floating gate formed over a channel region between said source region and said drain region, and a control gate formed over said floating gate, said memory cells storing data in accordance with a quantity of charges stored on said floating gate.

* * * * *